(12) United States Patent
Kawasaki (10) Patent No.: US 11,163,231 B2
(45) Date of Patent: Nov. 2, 2021

(54) PLANARIZATION APPARATUS, PLANARIZATION METHOD, AND ARTICLE MANUFACTURING METHOD

(71) Applicant: CANON KABUSHIKI KAISHA, Tokyo (JP)

(72) Inventor: Youji Kawasaki, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 141 days.

(21) Appl. No.: 16/561,838

(22) Filed: Sep. 5, 2019

(65) Prior Publication Data

US 2020/0089108 A1 Mar. 19, 2020

(30) Foreign Application Priority Data

Sep. 13, 2018 (JP) .............................. JP2018-171936

(51) Int. Cl.

| | |
|---|---|
| *G03F 7/00* | (2006.01) |
| *G03F 7/20* | (2006.01) |
| *B29C 43/58* | (2006.01) |
| *B29C 33/42* | (2006.01) |
| *H01L 21/3105* | (2006.01) |
| *H01L 21/67* | (2006.01) |

(52) U.S. Cl.
CPC .......... *G03F 7/0002* (2013.01); *B29C 33/424* (2013.01); *B29C 43/58* (2013.01); *G03F 7/70775* (2013.01); *G03F 7/70825* (2013.01); *G03F 7/70925* (2013.01); *H01L 21/31051* (2013.01); *H01L 21/67259* (2013.01)

(58) Field of Classification Search
CPC ............... G03F 7/0002; G03F 7/70925; G03F 7/70825; G03F 7/70775; H01L 21/31051
USPC ......................................................... 264/293
See application file for complete search history.

(56) References Cited

U.S. PATENT DOCUMENTS

| | | | |
|---|---|---|---|
| 2013/0300031 A1* | 11/2013 | Torii ..................... | B29C 59/026 264/293 |
| 2013/0313744 A1* | 11/2013 | Maruyama ............ | B29C 59/026 264/40.1 |
| 2016/0046065 A1* | 2/2016 | Takarada .............. | G03F 7/0002 264/494 |

(Continued)

FOREIGN PATENT DOCUMENTS

| | | |
|---|---|---|
| JP | 2007-234733 A | 9/2007 |
| JP | 2011-529629 A | 12/2011 |

(Continued)

*Primary Examiner* — Hung Nguyen
(74) *Attorney, Agent, or Firm* — Canon U.S.A., Inc. IP Division (57) ABSTRACT

There is provided a planarization apparatus that planarizes composition in a specified region on a substrate using a planar section of a mold. The planarization apparatus includes a mold holding unit configured to hold the mold, a measurement unit configured to measure a shape of the planar section of the mold held by the mold holding unit and convexly deformed, and a control unit configured to align, based on a result of measurement by the measurement unit, the planar section of the mold and the substrate with respect to a direction along a surface of the substrate so as to bring the planar section of the mold into contact with the specified region on the substrate, and bring the mold and the composition into contact with each other.

16 Claims, 5 Drawing Sheets

(56) References Cited

U.S. PATENT DOCUMENTS

2016/0349634 A1* 12/2016 Tanaka .................. G03F 9/7042

FOREIGN PATENT DOCUMENTS

| JP | 2012-099790 A | 5/2012 |
| JP | 2016-127168 A | 7/2016 |

* cited by examiner

PLANARIZATION APPARATUS, PLANARIZATION METHOD, AND ARTICLE MANUFACTURING METHOD

BACKGROUND

Field of the Disclosure

The present disclosure relates to a planarization apparatus, a planarization method, and an article manufacturing method.

Description of the Related Art

As the miniaturization of semiconductor devices is increasingly required, in addition to the conventional photolithography, a miniaturization technology attracts attention. In the miniaturization technology, an uncured composition on a substrate is molded with a mold and then cured, and a pattern of the composition is formed on the substrate. Such technology is called an imprint technology, and enables the formation of a fine pattern in the order of several nanometers on a substrate.

An example of the imprint technology includes a photocuring method. In an imprint apparatus employing a photocuring method, a photocurable composition supplied to a shot region on a substrate is molded with a mold and then irradiated with light to be cured, and the mold is separated from the cured composition to thereby form a pattern on the substrate.

Recently, Japanese Unexamined Patent Application Publication (Translation of PCT Application) No. 2011-529629 discusses a technique for planarizing composition on a substrate using an imprint technology. The technique discussed in Japanese Unexamined Patent Application Publication No. 2011-529629 (Translation of PCT Application) is directed to improving the accuracy of planarization by dripping the composition based on the level difference of the substrate, bringing a flat face of a mold into contact with the dripped composition, and curing the composition in contact with the flat face of the mold.

In a conventional planarization apparatus, however, no pattern or alignment mark is formed on the mold, so that it is not possible to measure in advance the position of the mold carried in the planarization apparatus. If the mold position cannot be measured in advance, a mold chuck for holding the mold is displaced from the mold, which may cause the mold to be brought into contact with the composition on the substrate in a distorted manner, or may lead to an inadequate planarization of the composition on the substrate.

SUMMARY

According to an aspect of the present invention, a planarization apparatus configured to planarize composition in a specified region on a substrate using a planar section of a mold, includes a mold holding unit configured to hold the mold, a measurement unit configured to measure a shape of the planar section of the mold held by the mold holding unit and convexly deformed with respect to the substrate, and a control unit configured to align, based on a measurement result of the measurement unit, the planar section of the mold with the specified region on the substrate, so as to bring the mold and the composition into contact with each other.

Further features of the present invention will become apparent from the following description of exemplary embodiments with reference to the attached drawings.

DESCRIPTION OF THE EMBODIMENTS

Exemplary embodiments of the present invention will be described in detail based on the accompanying drawings. In the drawings, the same components are denoted by the same reference numbers, and redundant explanation will not be repeated.

Figure 1:
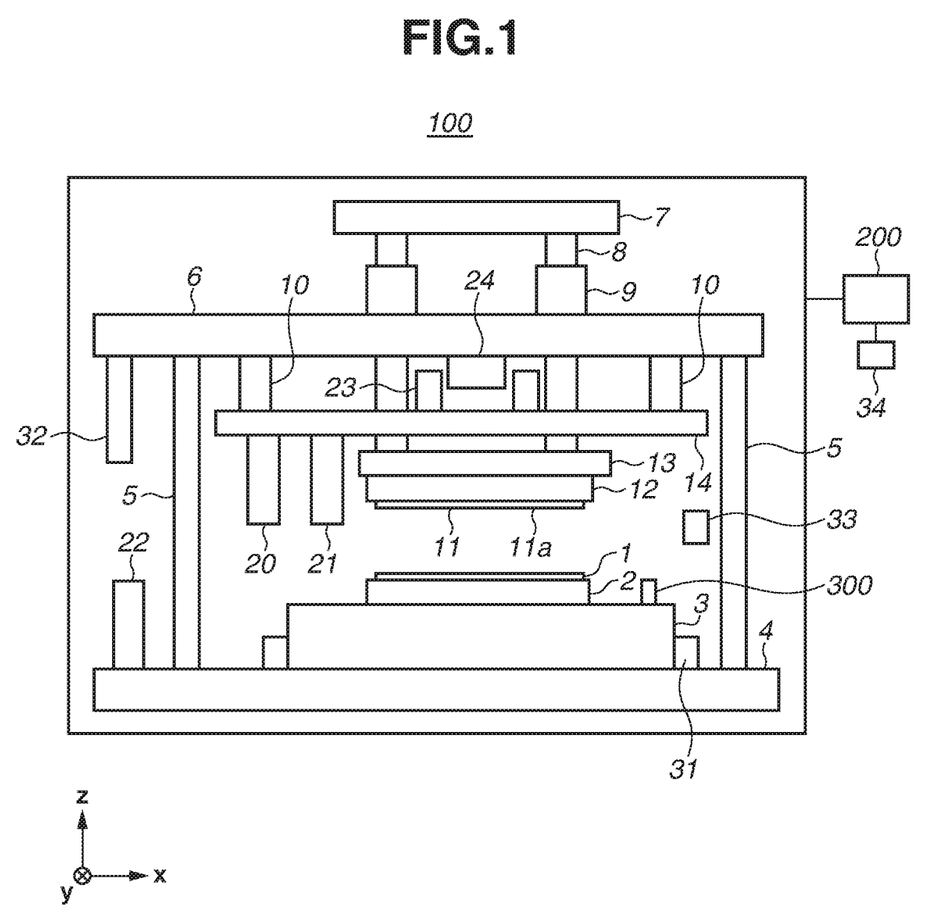
FIG. 1 is a schematic diagram illustrating a configuration of a planarization apparatus.

FIG. 1 is a schematic diagram illustrating a configuration of a planarization apparatus 100 according to an exemplary embodiment. The planarization apparatus 100 is embodied by a molding apparatus for molding composition on a substrate 1 using a mold 11 (template) and, in the present exemplary embodiment, planarizes the composition on the substrate 1. The planarization apparatus 100 brings the composition on the substrate 1 into contact with the mold 11, then cures the composition in the contact state, and separates the mold 11 from the cured composition to thereby form a flat surface, in a large area or a small area, of the composition on the substrate 1.

The base material to be used for the substrate 1 is typically a silicon wafer, but the present invention is not limited thereto. The substrate 1 may optionally be selected from among the substrates made of aluminum, titanium-tungsten alloy, aluminum-silicon alloy, aluminum-copper-silicon alloy, silicon oxide, silicon nitride, and the like, which are known as a substrate for semiconductor device. The substrate 1 may also be a substrate having an adhesive layer formed by a surface treatment, such as silane coupling treatment, silazane treatment, and organic thin film formation, so as to improve the adhesion to a curable composition. The substrate 1 typically has the shape of a circle with a diameter of 300 mm. However, the present invention is not limited thereto.

Taking account of a light irradiation process, the mold 11 is preferably made of a light transmitting material. Specific examples of the material to be used for the mold 11 preferably include glass, quartz, a transparent resin such as a polymethyl methacrylate (PMMA) and a polycarbonate resin, a transparent metal-deposited film, a flexible film of polydimethylsiloxane, a photo-cured film, and a metallic film. The mold 11 preferably has a circular shape with a diameter of more than 300 mm and less than 500 mm. However, the present invention is not limited thereto. The thickness of the mold 11 is preferably 0.25 mm or more and less than 2 mm. However, the present invention is not limited thereto.

The composition on the substrate 1 is preferable a UV-curable fluid. Typically, a monomer such as an acrylate or a methacrylate may be used. An imprint material used in an imprint apparatus may also be used as the composition. In this regard, a curable composition (also referred to as "uncured resin") that is cured by means of a curing energy is used for the imprint material. Examples of the curing energy include electromagnetic radiation and heat. Infrared light, visible light, or ultraviolet light whose wavelength is selected from the range of 10 nm to 1 mm may be used as the electromagnetic radiation.

The curable composition is composition curable by the irradiation with light or by heating. The photocurable composition to be cured by the irradiation with light contains at least a polymerizable compound and a photopolymerization initiator, and may contain a non-polymerizable compound or a solvent, as required. The non-polymerizable compound is at least one selected from the group consisting of a sensitizer, a hydrogen donor, an internal releasing agent, a surfactant, an antioxidant, a polymeric component, and the like.

The imprint material may be applied in the form of a film onto the substrate by a spin coater or a slit coater. The imprint material may also be applied onto the substrate by a fluid injection head, in the form of droplets or of an island or film formed of droplets linked with one another. The viscosity (viscosity at 25° C.) of the imprint material is 1 mPa·s or more and not more than 100 mPa·s, for example.

The planarization apparatus 100 includes a substrate chuck 2 (substrate holding unit), a substrate stage 3, a base table 4, posts 5, a top plate 6, a guide bar plate 7, a guide bar 8, a mold driving unit 9, posts 10, a mold chuck 12, a head 13, and an alignment scope shelf 14. The planarization apparatus 100 also includes a fluid supply unit 20, an off-axis scope 21, a substrate conveyance unit 22, an alignment scope 23, a light source 24, a stage driving unit 31, a mold conveyance unit 32, a washing unit 33, an input unit 34, and a control unit 200. The substrate chuck 2 and the substrate stage 3 constitute a substrate holding unit to hold the substrate 1, while the mold chuck 12 and the head 13 constitute a mold holding unit to hold the mold 11. In the present exemplary embodiment, assuming that the plane on which the substrate 1 is arranged is the xy-plane and the direction orthogonal thereto to be the z direction, the xyz coordinate system in FIG. 1 is defined.

Referring to FIG. 1, the substrate 1 is carried in from the outside of the planarization apparatus 100 by the substrate conveyance unit 22 including a conveyance hand, and held by the substrate chuck 2. The substrate stage 3 is supported by the base table 4 and driven in the x-axis direction and the y-axis direction in order to position the substrate 1 that is held by the substrate chuck 2 at a specified position. The stage driving unit 31 includes a linear motor and an air cylinder, and drives (displaces) the substrate stage 3 at least in the x-axis direction and the y-axis direction. The stage driving unit 31 may have a function of driving the substrate stage 3 in more than two axial directions (e.g., six axial directions). The stage driving unit 31 includes a rotation mechanism to rotationally drive (rotate) the substrate chuck 2 or the substrate stage 3 about an axis parallel to the z-axis direction.

The mold 11 is carried in from the outside of the planarization apparatus 100 by the mold conveyance unit 32 including a conveyance hand, and held by the mold chuck 12 (mold holding unit). The mold 11 has, for example, a circular or rectangular outer shape, and includes a planar section 11a on a surface facing the substrate 1 (bottom surface of the mold 11). The planar section 11a has rigidity allowing the planar section 11a, which has come into contact with composition in a specified region on the substrate 1, to conform to the surface shape of the substrate 1. The planar section 11a has a region as large as the substrate 1 or larger than the substrate 1. The planar section 11a of the mold 11 does not have any uneven pattern (i.e., changed in height stepwise) and is (approximately) planar if not deformed by the exertion of force or due to its own weight. Preferably, the planar section 11a is convexly or concavely deformable under specified conditions. The planar section 11a may also become substantially planar as a result of the exertion of a specified force (e.g., application of a specified air pressure onto the back side of the section).

The mold chuck 12 is supported by the head 13 and has a function of correcting the rotation of the mold 11 about the z-axis direction. The mold chuck 12 and the head 13 each has an opening allowing light (ultraviolet light) emitted from the light source 24 through a collimator lens to pass. In addition, the mold chuck 12 or the head 13 is provided with a load cell for measuring the pressing force (imprinting force) of the mold 11 against composition on the substrate 1.

On the base table 4, the posts 5 are arranged to support the top plate 6. The guide bar 8 penetrates the top plate 6, and one end of the guide bar 8 is fixed to the guide bar plate 7 and the other end to the head 13. The mold driving unit 9 is a mechanism for driving the head 13 in the z-axis direction through the guide bar 8 so as to cause the mold 11 held by the mold chuck 12 to come into contact with the composition on the substrate 1 or to be separated from the composition on the substrate 1. The mold driving unit 9 has a function of driving the head 13 to move in the x-axis direction and/or the y-axis direction, and a function of rotationally driving the mold chuck 12 or the head 13 about the z-axis direction.

The alignment scope shelf 14 is suspended from the top plate 6 through the posts 10. The guide bar 8 extends through the alignment scope shelf 14. The alignment scope shelf 14 is provided with, for example, a height measurement system (not illustrated) for measuring the height (flatness) of the substrate 1 held by the substrate chuck 2 by the image field deviation measurement methodology using oblique illumination.

The off-axis scope 21 is supported by the alignment scope shelf 14. The off-axis scope 21 is used for a global alignment process for detecting alignment marks provided in a plurality of shot regions of the substrate 1 to determine the position of each shot region.

The alignment scope 23 includes an image pickup system and an optical system for observing a reference mark provided on the substrate stage 3 and an alignment mark provided on the mold 11. However, the alignment scope 23 may be omitted if no alignment marks are provided on the mold 11. The alignment scope 23 is used for measuring relative positions of a reference mark provided on the substrate stage 3 and an alignment mark provided on the mold 11 for alignment the positional deviation therebetween. An alignment between the mold 11 and the substrate 1 is achieved by determining the positional relationship between the mold 11 and the substrate stage 3 with the alignment scope 23 and determining the positional relationship between the substrate stage 3 and the substrate 1 with the off-axis scope 21.

The fluid supply unit 20 includes a dispenser having an ejection port (nozzle) to eject an uncured (fluid) composition to the substrate 1, and drips composition so as to provide (supply) droplets of the composition on the substrate 1. The fluid supply unit 20, which employs, for example, a piezojet system or a micro-solenoid system, is capable of supplying composition in the form of droplets of minute volumes on the substrate 1. The ejection port in the fluid supply unit 20 is not limited in number and the fluid supply unit 20 may include one nozzle (single nozzle) or a plurality of nozzles. In other words, the fluid supply unit 20 may include a linear nozzle array or a plurality of linear nozzle arrays in combination.

The washing unit 33 washes (cleans) the mold 11 held by the mold chuck 12. The washing unit 33 removes the composition adhering to the mold 11, to the planar section 11a in particular After the mold 11 is separated from the cured composition on the substrate 1. The washing unit 33 may wipe off the residual composition adhering to the mold 11 or remove the composition adhering to the mold 11 using UV irradiation, wet washing, plasma washing or the like.

The control unit 200 includes a processing unit, such as a central processing unit (CPU), another type of processor, or a field programmable gate array (FPGA), and a storage unit such as a memory, to control the entire planarization apparatus 100. The control unit 200 functions as the processing unit that integrally controls individual components of the planarization apparatus 100 to conduct planarization processing. The planarization processing refers to the processing of planarizing the composition by bringing the planar section 11a of the mold 11 into contact with composition in a specified region on the substrate 1 and causing the planar section 11a of the mold 11 to conform to the surface shape of the substrate 1. The planarization processing is generally conducted lot by lot, i.e., conducted on each of a plurality of substrates included in one lot. The control unit 200 may be provided inside the planarization apparatus 100 or anywhere other than the place where the planarization apparatus 100 is set, so as to remotely control the planarization apparatus 100.

The outline of planarization processing is described with reference to FIGS. 2A to 2C. In the present exemplary embodiment, composition is dispensed or dripped on the entire surface of the substrate 1 and brought into contact with the mold 11 to be planarized. Composition in a partial region on the substrate 1 may be brought into contact with the mold 11 to be planarized.

Figure 2A:
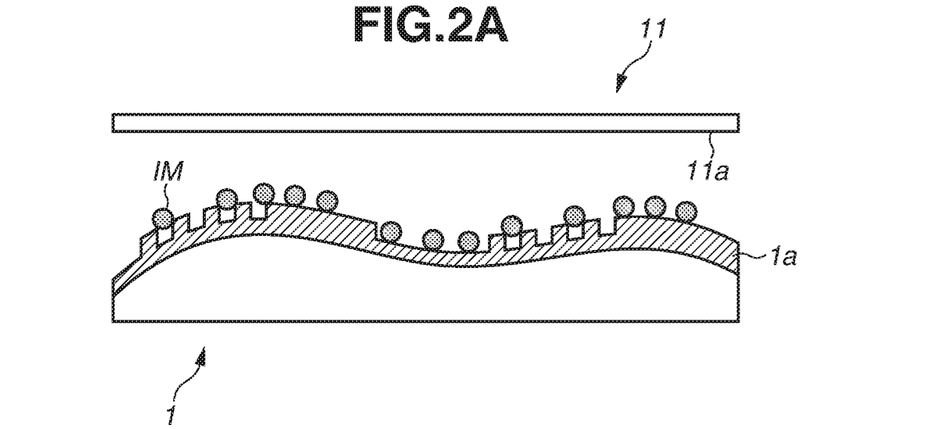
FIGS. 2A to 2C are diagrams illustrating an outline of planarization processing.
Figure 2B:
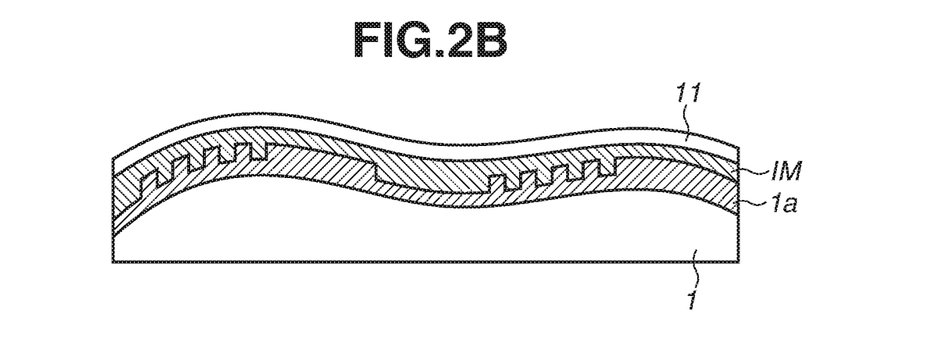
Figure 2C:
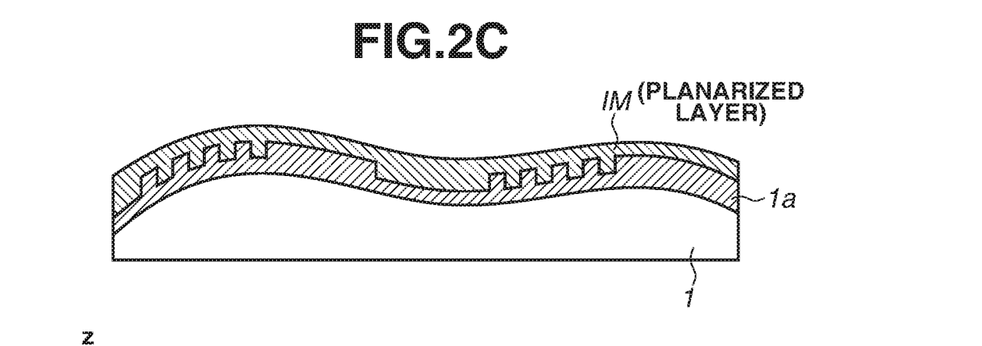

As illustrated in FIG. 2A, a base pattern 1a is formed on the substrate 1. Composition imprint material (IM) is dispensed from the fluid supply unit 20 on the base pattern 1a FIG. 2A illustrates a state where the composition IM has already been supplied onto the substrate 1 but is not brought into contact with the mold 11 yet. As illustrated in FIG. 2B, the composition IM in a specified region on the substrate 1 and the planar section 11a of the mold 11 are brought into contact with each other. FIG. 2B illustrates a state where the planar section 11a of the mold 11 is completely in contact with the composition IM on the substrate 1 and is conform to the surface shape of the substrate 1. In the state illustrated in FIG. 2B, light from the light source 24 is irradiated through the mold 11 on the composition IM so as to cure the composition IM. As illustrated in FIG. 2C, the mold 11 is separated from the cured composition IM on the substrate 1. In this way, a planarized layer of the composition IM with a uniform thickness is formed over the entire surface of the substrate 1. FIG. 2C shows the planarized layer of the composition IM that has been formed on the substrate 1.

Since the mold 11 has no pattern or alignment mark formed thereon, it is not possible, during the planarization processing, to perform a measurement in advance for alignment when the mold 11 is conveyed. The mold 11 has neither a patterned region nor an alignment mark formed thereon, so that the position of the mold 11 carried in the planarization apparatus 100 is not accurately determined. Therefore, the position of the center of the mold 11, at which the mold 11 start coming into contact with the composition IM on the substrate 1, is not known, and it is not possible to align the center of the mold 11 and the center of the substrate 1 with each other.

Accordingly, the mold 11 is conveyed solely with the accuracy of the mold conveyance unit 32, which makes the mold 11 easier to distort and displace as the mold 11 has a larger area, leading to the displacement between the center of the mold 11 and the center of the mold chuck 12. As a result, the center of the mold 11 is displaced from the center of the substrate 1, and the center of information about the position of the dripped imprint material on the substrate 1 is displaced from the center of the mold 11. As a result, a protruded portion may be generated due to an asymmetric imprinting.

In order to solve such a problem, in the present exemplary embodiment, the center of the mold 11 is determined by measuring the shape of the mold 11 held by the mold chuck 12 and bent convexly. In the present exemplary embodiment, a convex shape of the mold 11 is measured by measuring the distance to the mold 11 using a measurement unit 300 provided in the planarization apparatus 100.

Figure 3:
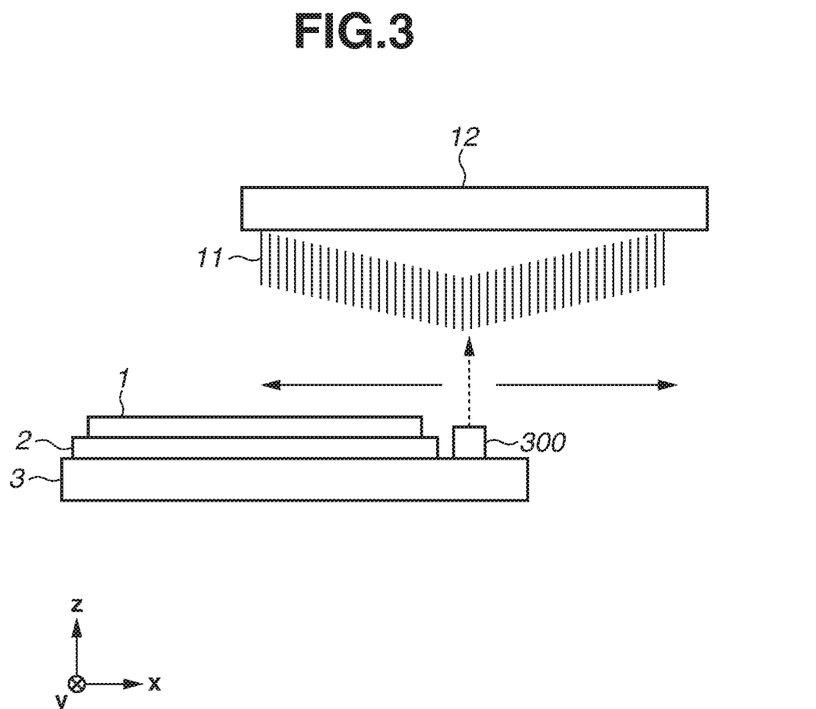
FIG. 3 is a diagram illustrating a method for measuring a shape of a mold in the planarization apparatus.

A method of measuring a shape of the mold 11 will be described with reference to FIG. 3 below. FIG. 3 is a cross-sectional view of the mold 11 held by the mold chuck 12 and the substrate stage 3. Since the planar section 11a of the mold 11 used in the planarization apparatus 100 has a large area and a small thickness, the mold 11 may be deformed toward the substrate 1 (downward in the vertical direction, that is, convexly along the z-direction) due to its own weight. The level convex shape can be measured by measuring the distance between the mold 11 and the measurement unit 300 by the measurement unit. The control unit 200 of the planarization apparatus 100 uses the result of measurement by the measurement unit 300 to determine if a convex shape of the mold 11 exists. In the present exemplary embodiment, the planar section 11a of the mold 11 is convexly deformed toward the substrate 1 (downward in the vertical direction) due to its own weight, but the present invention is not limited thereto. The planar section 11a may be deformed concavely on the side facing the substrate 1 by reducing the pressure on the back side of the planar section 11a as compared with the pressure on the front side. Such deformation of the planar section 11a into a shape other than the planar shape can be used for the alignment as will be described below. For example, alignment with the region subjected to planarization (specified region or planarization target region) on the substrate 1 can be achieved by using a vertex portion of a convex shape, a bottom portion of a concave shape, or both of them.

The measurement unit 300 can use a displacement sensor employing an interferential system or a distance measuring device for measuring a distance such as a gap sensor. As illustrated in FIG. 3, the measurement unit 300 is provided on the substrate stage 3. The measurement unit 300 measures the mold 11 in a direction (the z-axis) from the substrate 1 (substrate stage 3), which makes it possible to detect the position where the distance between the mold 11 and the substrate stage 3 is shortest (i.e., where the mold 11 is nearest to the substrate 1). The position where the distance between the convexly deformed mold 11 and the measurement unit 300 is shortest represents a position of the mold 11 when the mold 11 comes into contact with the composition IM on the substrate 1 for the first time. For this reason, the position where the distance to the mold 11 measured by the measurement unit 300 is shortest is determined as the center of the mold 11. The center of the mold 11 thus determined and the center of the substrate 1 are to be aligned with each other.

In order to measure a convex shape of the mold 11 (center of the mold 11) using the measurement unit 300, the substrate stage 3 having the measurement unit 300 provided thereon is driven to measure the distance to the mold 11 at a plurality of positions on the front surface of the mold 11 that is facing the substrate 1. The measurement unit 300 can measure the distance to the planar section 11a of the mold 11 at a plurality of positions by driving the substrate stage 3 to move in the x direction and the y direction. This, the center of the mold 11 is determined using the results of the measurement of the mold 11 that has been performed by the measurement unit 300 along the x direction and the y direction.

The above description is made in a case where the shape of the mold 11 convexly deformed due to its own weight is measured by the measurement unit 300. However, the center of the mold 11 may be determined in a state where the planar section 11a of the mold 11 is convexly deformed on purpose. In that case, the planarization apparatus 100 is provided with a deformation unit (not illustrated) that expands the shape of the mold 11 to deform the mold 11 into a convex shape toward the substrate 1. The deformation unit applies pressure to the back surface of the mold 11 (surface of the mold 11 opposite to the planar section 11a) to convexly deform the mold 11. It is thus possible to measure a convex shape of the mold 11, which has convexly been deformed on purpose, by the measurement unit 300 on the substrate stage 3. In this way, the planarization apparatus 100 can align the mold 11 and the substrate 1 with each other based on the results of the measurement, which has been performed by the measurement unit 300 on the shape of the mold 11 deformed into a shape convex toward the substrate 1, and can bring the mold 11 to be kept deformed and the composition IM on the substrate 1 into contact with each other. Since the shape of the mold 11 is measured and the mold 11 is brought into contact with the composition IM on the substrate 1 while the mold 11 is kept deformed, the time required for the planarization of the composition IM on the substrate 1 after the mold 11 is carried in the planarization apparatus 100 can be reduced.

The measurement unit 300, which is provided on the substrate stage 3 in the present exemplary embodiment, does not necessarily need to be provided on the substrate stage 3. For example, the measurement unit 300 may be provided on a stage independent of the substrate stage 3 as long as the measurement unit 300 can measure, at a plurality of positions along the surface, the distances to a surface (planar section 11a) of the mold 11 facing the substrate 1.

By measuring the distance to the mold 11 while driving the substrate stage 3 to move in the xy plane, the position at which the distance between the mold 11 and the substrate stage 3 (substrate 1) is of the smallest measurement value is determined as the center of the mold 11. The planarization apparatus 100 according to the present exemplary embodiment can bring into contact with each other the center of the mold 11 and the composition at the center of a planarization target region on the substrate 1 by aligning the center of the mold 11 determined in this way and the center of the substrate 1 with each other to conduct planarization processing.

In the exemplary embodiment described above, the shape of the mold 11 is determined by using the measurement unit 300 on the substrate stage 3 to measure the distance to the mold 11 in a direction from the substrate 1. However, the method to determine the shape of the mold 11 is not limited to the method illustrate in FIG. 3. For example, as illustrated in FIG. 4, the measurement unit 300 may measure the distance to the mold 11 in a direction from a lateral side of the mold 11 (direction along the xy-plane) so as to measure a convex shape of the mold 11.

Figure 4:
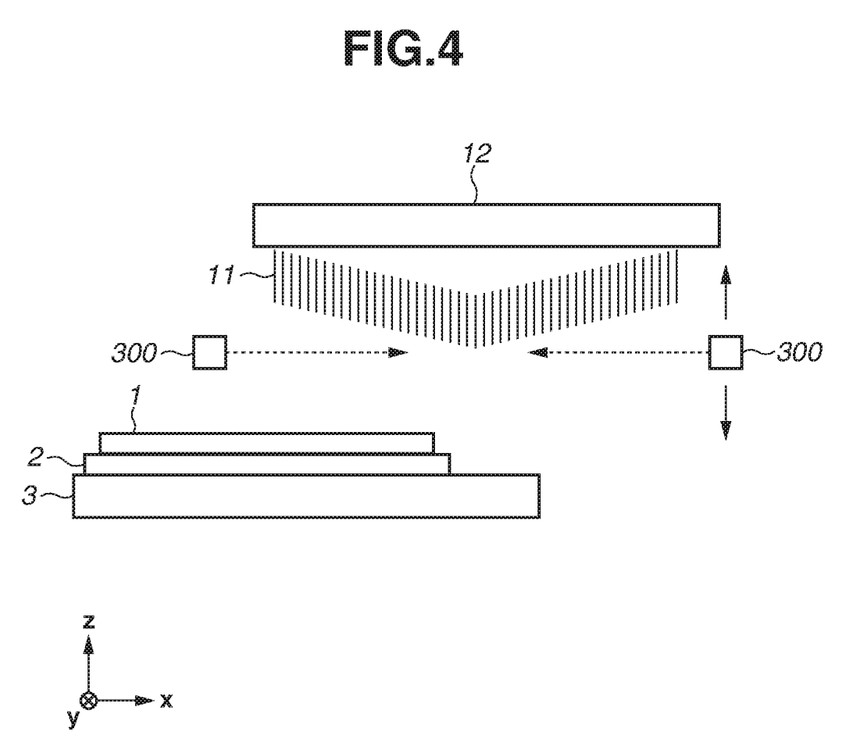
FIG. 4 is a diagram illustrating a method for measuring the shape of the mold in the planarization apparatus.

Referring to FIG. 4, another method of measuring the shape of the mold 11 will be described. FIG. 4 is a cross-sectional view of the mold 11 held by the mold chuck 12 and the substrate stage 3. Since the planar section 11a of the mold 11 used in the planarization apparatus 100 has a large area and a small thickness, the mold 11 held by the mold chuck 12 may convexly be deformed toward the substrate 1 due to its own weight. As illustrated in FIG. 4, in a state where the mold 11 is fixed to the mold chuck 12 by suction, the distance to the mold 11 is measured in a direction along the xy-plane. The control unit 200 of the planarization apparatus 100 uses the results of measurement by the measurement unit 300 to determine a convex shape of the mold 11.

The measurement unit 300 can use a displacement sensor employing an interferential system or a distance measuring device for measuring distance called a gap sensor. As illustrated in FIG. 4, the measurement unit 300 is provided in a region outside the mold 11 in the xy-plane. In addition, the measurement unit 300 illustrated in FIG. 4 is movable in the direction (z direction) perpendicular to the surface of the substrate 1. The measurement unit 300 measures the mold 11 in a direction along the xy-plane while moving in the z direction to thereby detect the position in the z direction of the lowermost point of the mold 11 convexly deformed (i.e., the position where the mold 11 is nearest to the substrate 1) and the distance from the measurement unit 300 to the mold 11 at that time. FIG. 4 illustrates the measurement of the position of the lowermost point of the mold 11 in the x direction. Likewise, a convex shape of the mold 11 (lowermost point of the mold 11) in the xy-plane is determined by measuring the position of the lowermost point of the mold 11 in the y direction. The position of the lowermost point of the mold 11 convexly deformed is a position at which the mold 11 comes into contact with the composition on the substrate 1 for the first time. For this reason, the position of the lowermost point of the mold 11 measured by the measurement unit 300 is determined to be the center of the mold 11. The center of the mold 11 thus determined and the center of the substrate 1 are aligned with each other.

In order to measure a convex shape of the mold 11 (center of the mold 11) using the measurement unit 300, the measurement unit 300 is moved in the z direction and to measure the distance to the mold 11 in a direction along the xy-plane at a plurality of positions on the front face of the mold 11. The measurement unit 300 can measure the distance to the planar section 11a of the mold 11 at a plurality of positions by moving the measurement unit 300 in the z direction. Therefore, the center of the mold 11 is determined by using the results of the measurement of the mold 11 along the z direction performed by the measurement unit 300.

The center of the mold 11 may be determined in a state where the planar section 11a of the mold 11 is convexly deformed on purpose, as is the case with the example in FIG. 3. In that case, the planarization apparatus 100 is provided with a deformation unit (not illustrated) that expands the shape of the mold 11 to deform the mold 11 into a shape convex toward a face of the substrate 1. The deformation unit applies pressure to the back face of the mold 11 (face of the mold 11 opposite to the planar section 11a) to convexly deform the mold 11.

Measuring the distance to the mold 11 with the measurement unit 300 moving in the z direction makes it possible to measure the lowermost point of the mold 11 convexly deformed and determine the position of the lowermost point as the center of the mold 11. The planarization apparatus 100 according to the present exemplary embodiment can bring the center of the mold 11 into contact with the composition at the center of a planarization target region on the substrate.

Figure 5:
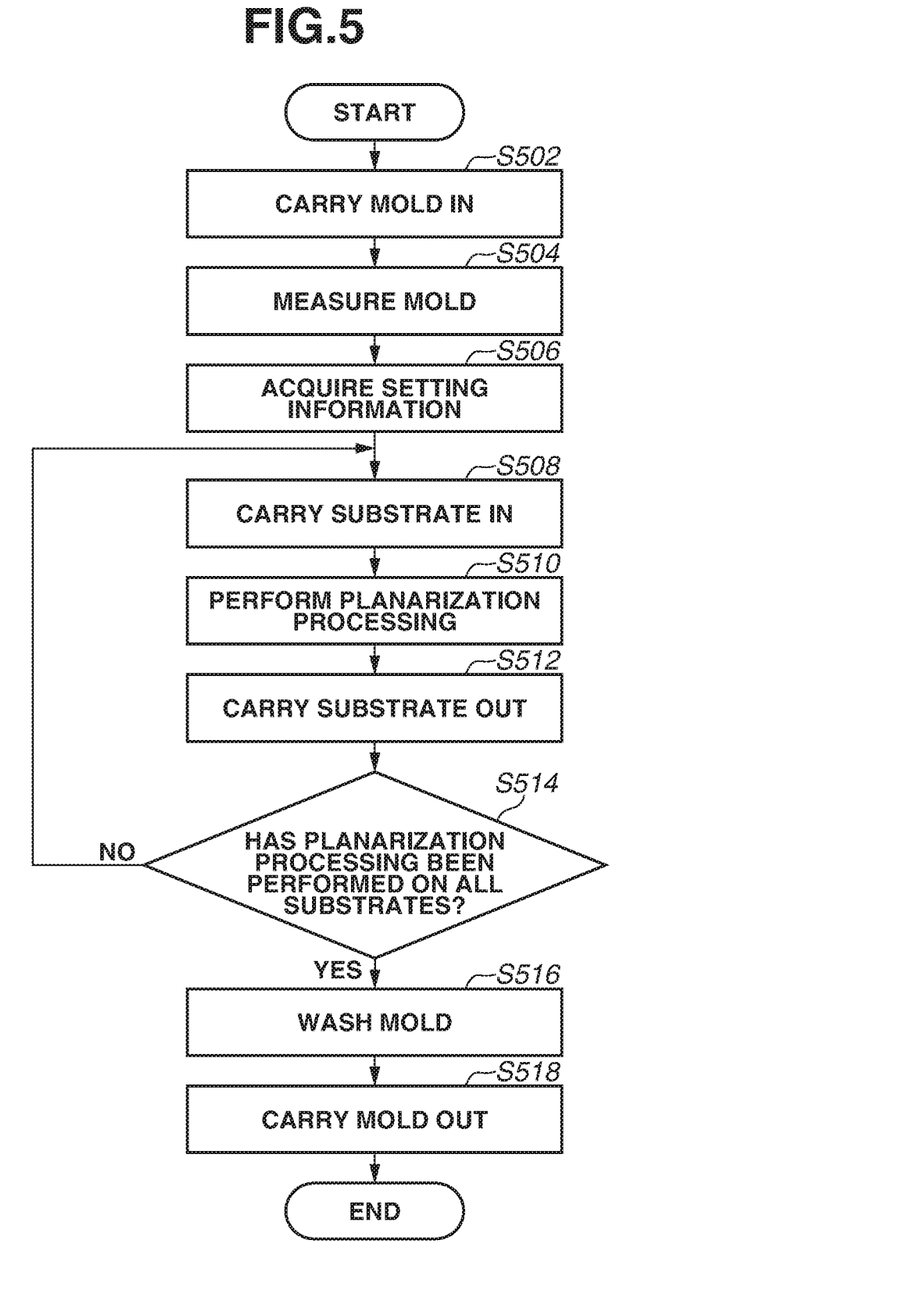
FIG. 5 is a flowchart illustrating planarization processing in the planarization apparatus.

The planarization processing performed by the planarization apparatus 100 according to the present exemplary embodiment will be described with reference to FIG. 5. FIG. 5 is a flowchart of the planarization processing. As described above, the planarization processing is performed by the control unit 200 integrally controlling individual components of the planarization apparatus 100 during the planarization processing.

In step S502, the mold 11 is carried in the planarization apparatus 100 by the mold conveyance unit 32 and held by the mold chuck 12. In step S504, the mold 11 convexly deformed is measured using the measurement unit 300 so as to determine the center of the mold 11. In step S506, setting information about the planarization processing is acquired. The setting information about the planarization processing may include the density (e.g., cycle or width) of the base pattern 1a already formed on the substrate 1 and the final thickness (thickness after curing) of the composition IM. The setting information about the planarization processing may also include the center of the mold 11 determined in step S504. Such setting information may be input through the input unit 34 of the planarization apparatus 100.

In step S508, the substrate 1 to be processed among the substrates included in the same lot is carried in the planarization apparatus 100 by the substrate conveyance unit 22 and held by the substrate chuck 2. In step S510, the substrate 1 carried in step S508 is supplied with the composition IM by the fluid supply unit 20 based on droplet arrangement pattern data, and subjected to the planarization processing, which has been described with reference to FIGS. 2A to 2C. The planarization processing is performed by using the setting information about the planarization processing acquired in step S506. In particular using information on the position of the center of the mold 11, the center (center of a convex shape) of the mold 11 and the center of the substrate 1 are aligned with each other to bring the mold 11 into a uniform contact with the imprint material on the substrate 1.

In step S512, the substrate 1 having been subjected to the planarization processing is carried out of the substrate chuck 2 by the substrate conveyance unit 22. In step S514, it is determined whether the planarization processing has been conducted on all the substrates 1 included in the same lot. If the planarization processing has not been performed on all the substrates 1 included in the same lot (NO in step S514), the processing proceeds to step S508 in order to provide the substrate 1 to be processed next on the substrate chuck 2. If the planarization processing has been performed on all the substrates 1 included in the same lot (YES in step S514), the processing proceeds to step S516.

In step S516, the mold 11 held by the mold chuck 12 is washed by the washing unit 33. In other words, the composition adhering to the planar section 11a of the mold 11 is removed. In step S518, the mold 11 after washing is carried out of the planarization apparatus 100 by the mold conveyance unit 32.

In the present exemplary embodiment, the mold 11 is washed after the planarization processing is completed with respect to all the substrates 1 included in the same lot and before the mold 11 is carried out of the planarization apparatus 100. However, it is not limited thereto. For example, the mold 11 may be washed even if the planarization processing is not complete with respect to all the substrates 1 included in the same lot. If the planarization apparatus 100 is provided with a detection unit to detect the adhesion state of composition on the planar section 11a of the mold 11, the mold 11 may be washed according to the results of detection by the detection unit.

In the present exemplary embodiment, the planarization method for curing composition using a photo-curing method is described. The curing method to be used is not limited to the photo-curing method, and may be a heat curing method for curing an imprint material with heat.

<Article Manufacturing Method>

Next, a method of manufacturing articles (e.g., semiconductor integrated circuit device, fluid crystal display device, color filter, and microelectromechanical system (MEMS)) using the planarization apparatus or planarization method described above will be described. The article manufacturing method includes steps of bringing composition provided on a substrate (e.g., wafer or a glass substrate) and a mold into contact with each other to planarize the composition, curing the composition, and separating the mold from the composition, by using the planarization apparatus described above. Articles are manufactured by subjecting the substrate with the planarized composition thereon to steps of processing such as patterning with a lithography apparatus, and subjecting the substrate thus processed to other known processing steps. Other known processing steps include etching, resist stripping, dicing, bonding, and packaging. The present article manufacturing method enables manufacturing articles with a higher quality than ever.

The exemplary embodiments of the present invention has been described above. However, it is needless to say that the present invention is in no way limited to such exemplary embodiments, and various modifications and changes can be made within the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-171936, filed Sep. 13, 2018, which is hereby incorporated by reference herein in its entirety.

What is claimed is:

1. A planarization apparatus configured to planarize composition on a specified region of a substrate using a planar section of a mold, the planarization apparatus comprising:
   a mold holding unit configured to hold the mold;
   a measurement unit configured to measure a shape of the planar section of the mold held by the mold holding unit and convexly deformed with respect to the substrate; and
   a control unit configured to align the planar section of the mold with the substrate based on a measurement result of the measurement unit, and to control the planar section of the mold to come into contact with the composition on the specified region of the substrate after alignment,
   wherein the planar section of the mold has a same or larger size as a size of the substrate, and
   wherein, when the planar section of the mold comes into contact with the composition on the substrate, the planar section of the mold conforms to a surface shape of the substrate.

2. The planarization apparatus according to claim 1, wherein the measurement unit measures a distance between a surface of the mold and the measurement unit.

3. The planarization apparatus according to claim 2, wherein the measurement unit measures the distance at a plurality of positions in a direction along a surface of the mold.

4. The planarization apparatus according to claim 2, wherein the measurement unit is arranged at a position adjacent to the substrate.

5. The planarization apparatus according to claim 1, wherein the measurement unit is provided on a substrate holding unit configured to hold the substrate.

6. The planarization apparatus according to claim 1, wherein the measurement unit is arranged at a position to measure a lateral distance to the mold.

7. The planarization apparatus according to claim 6, wherein the measurement unit measures, at a plurality of positions along a direction perpendicular to a surface of the substrate, a distance between the mold and the measurement unit.

8. The planarization apparatus according to claim 1, further comprising a deformation unit configured to deform the mold held by the mold holding unit into the shape convex toward the substrate.

9. The planarization apparatus according to claim 8,
wherein the measurement unit measures a distance between the measurement unit and the mold in a state where the mold is convexly deformed by the deformation unit, and
wherein the control unit determines a position of the mold at which a distance from the mold to the substrate is shortest.

10. The planarization apparatus according to claim 9, wherein the control unit aligns the position on the mold having a shortest distance from the mold to a center of a region of the substrate on which the composition is planarized.

11. The planarization apparatus according to claim 1, wherein the mold is brought into contact with the composition on the substrate in a state where the mold is deformed into a shape convex with respect to the substrate.

12. The planarization apparatus according to claim 1, wherein the composition is supplied to an entire surface of the substrate and planarized.

13. A planarization method for planarizing composition on a specified region of a substrate using a planar section of a mold, the planarization method comprising:
measuring a shape of the planar section of the mold held by a mold holding unit, the mold is convexly deformed with respect to the substrate;
aligning the planar section of the mold with the substrate based on a result of the measuring, and to control the planar section of the mold to come into contact with the specified region on the substrate after alignment; and
bringing the composition in the specified region on the substrate and the mold into contact with each other,
wherein the planar section of the mold has a size the same as or larger than a size of the substrate, and
wherein, when the planar section of the mold comes into contact with the composition on the substrate, the planar section of the mold conforms to a surface shape of the substrate.

14. An article manufacturing method, comprising:
planarizing composition on a specified region of a substrate using a planar section of a mold with a planarization method;
processing the substrate having the planarized composition; and
manufacturing an article from the processed substrate,
wherein the planarization method includes:
measuring a shape of the planar section of the mold held by a mold holding unit, the mold being convexly deformed with respect to the substrate;
aligning the planar section of the mold with the substrate based on a result of measuring the shape of the planar section of the mold; and
controlling the planar section of the mold to come into contact with the composition on the specified region of the substrate after alignment,
wherein the planar section of the mold has a size the same as or larger than a size larger than a size of the substrate, and
wherein, when the planar section of the mold comes into contact with the composition on the substrate, the planar section of the mold conforms to a surface shape of the substrate.

15. The planarization apparatus according to claim 1, wherein the planar section of the mold does not have any uneven pattern.

16. The planarization apparatus according to claim 1, further comprising a light source configured to emit curing light for curing the composition by irradiation through the mold, wherein in a state in which the planar section of the mold is in contact with the composition on the specified region of the substrate, the control unit causes the light source to irradiate the composition with the curing light to cure the composition on the specified region of the substrate.

* * * * *